United States Patent
Wada

(10) Patent No.: US 7,029,308 B2
(45) Date of Patent: Apr. 18, 2006

(54) SOCKET FOR ELECTRONIC MODULE

(75) Inventor: Shuntaro Wada, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 11/059,374

(22) Filed: Feb. 17, 2005

(65) Prior Publication Data

US 2005/0239302 A1 Oct. 27, 2005

(30) Foreign Application Priority Data

Apr. 23, 2004 (JP) ............... 2004-3119706

(51) Int. Cl.
*H01R 13/62* (2006.01)
(52) U.S. Cl. ..................... 439/330
(58) Field of Classification Search ........... 439/330, 439/331, 73

See application file for complete search history.

(56) References Cited

U.S. PATENT DOCUMENTS 4,354,720 A * 10/1982 Bakermans ............ 439/357
4,761,140 A * 8/1988 Geib ..................... 439/71
5,342,205 A * 8/1994 Hashiguchi ............. 439/66
6,805,562 B1 * 10/2004 Liao et al. ............. 439/68
6,877,993 B1 * 4/2005 Palaniappa et al. ...... 439/73
6,918,779 B1 * 7/2005 Liao .................... 439/342

FOREIGN PATENT DOCUMENTS

JP 2003-133021 5/2003

* cited by examiner

Primary Examiner—Gary F. Paumen
(74) Attorney, Agent, or Firm—Takeuchi&Kubotera, LLP

(57) ABSTRACT

In the socket (41), a receiving section is formed by a circumferential wall (12) and a restricting section that defines the position of the counter module (M) when it is placed in the receiving section. The latching member (20) is formed by directly forming or attaching to the circumferential wall an elastic bar that extends in the circumferential direction of the circumferential wall. The latching member (20) has a securing section and a latching section (23) that elastically displaces outward of the circumferential wall by flexion of the elastic bar, and the securing section and the latching section are provided away from each other in the circumferential direction.

17 Claims, 10 Drawing Sheets

SOCKET FOR ELECTRONIC MODULE

BACKGROUND OF THE INVENTION

1. Field of the Invention

The present invention relates to a socket for an electronic module.

2. Description of the Related Art

To connect an electronic module, in which a specific electronic circuit or component is built therein, to a circuit board, there is a method of connecting them without directly soldering the module to the circuit board. In this method, after connecting a socket to the circuit board by soldering, the module is attached to the socket so that respective terminals contact and are connected to each other. This method is employed in order to prevent damaging a component in the module by heat from soldering when the component in the module is weak to heat. For example, this type of socket is disclosed in JP 2003-133021 (Patent Reference 1).

As shown in FIG. 13, the socket of Patent Reference 1 is made of an insulating material, and is comprised of a bottom wall 51 and a circumferential wall 52 so as to form a receiving concave section 53 to place an electronic module M therein from the upper side. A plurality of terminals 54 are provided on two facing wall parts of the circumferential wall 52. Each terminal 54 has an L-shaped connecting section 54A, which is arranged so as to be at the same height level as the bottom surface of the bottom wall 51, and an elastic contact section 54B, which is curved so as to have S-shape at the inner surface of the circumferential wall.

In addition, a latching arm 56, which has elasticity by two grooves 55, are provided on each of other two facing wall parts of the circumferential wall 52. Each latching arm 56 has shorter length than the height of the circumferential wall 52, and has a catch 56A, which protrudes inward, on the upper inner surface of the latching arm 56.

To use this socket, it is first arranged on a specific circuit board, and connecting sections 54A of the terminals 54 are connected to corresponding circuit sections by soldering. Then, a module M is attached in the receiving concave section 53 of the socket, which is connected to the circuit board. Contact sections are provided on the side surfaces of the module M, and elastically contact with the contact sections 54B of the terminals 54. Accordingly, without influence of heat at the time of soldering, the module can be electrically connected to the circuit board via the socket. This module M is prevented from coming off from the circuit board being latched by the catches 56A of the latching arms 56 of the socket, and the connection is maintained.

In the socket of Patent Reference 1, the latching arm extends from the upper surface of the bottom wall, and it has shorter length than the height of the circumferential wall of the socket. Therefore, it is difficult to secure satisfactory elasticity in view of low profile components demand. In other words, since elasticity of the catches of the latching arms is not large enough, inserting force to attach the module has to be large, so that excess force will be applied to the latching arm, which could damage the components.

On the other hand, if the latching arm is made longer relative to the height of the circumferential wall, the height of the socket becomes larger, and it becomes inconvenient to handle the socket.

SUMMARY OF THE INVENTION

Accordingly, it is an object of this invention to provide a socket for an electronic module, which has a latching member, whereby enough elastic displacement can be achieved with small force by forming the latching arm using the circumferential wall of the socket in the circumferential direction.

In the socket for an electronic module in this invention, a receiving section to receive a module is formed by the circumferential wall and a restricting section that defines the position of the module in the receiving section when the module is inserted in the receiving section. In addition, a plurality of terminals are arranged along the circumferential wall, and one end of each terminal has a connecting section that can be connected to a circuit board, and the other end of each terminal has a contact section that contacts with a corresponding section of the module received in the receiving section.

According to this invention, the socket for a module has a latching member, which is formed by directly forming on or attaching along the circumferential wall an elastic bar, which extends in the circumferential direction. The latching member has a securing section and a latching section, which are provided away from each other in the circumferential direction. The latching section elastically displaces outward of the circumferential wall by flexion of the elastic bar. When the module is placed in the receiving section, the elastic bar receives pressure from the module by contacting and elastically displaces by flexing, so as to enable placing the module therein. Once the module reaches the specified position, the elastic flexing displacement is released or reduced, so that the latching section can latch the module thereon.

Usually, the module has a block-like shape, which has wide dimension relative to the height. Whole part of the module in the height direction is not placed in the receiving section of the socket, and the lower half portion is placed therein. In other words, the height of the circumferential wall of the socket, which forms the receiving section, is short. As described above, in this invention, the elastic bar of the latching member, which works as a latching section, is formed to extend in the circumferential direction, so that the elastic bar can securely have enough length to have elasticity no matter with the height of the circumferential wall. With this constitution, the elastic bar can be significantly elastically flexed outward relative to the receiving section, receiving pressure from the module by contacting with it when the module is attached into the receiving section. In other words, the latching section can significantly displace.

In this invention, the receiving section can be formed by the bottom wall of the housing made from an insulating material, which works as a restricting section, and a circumferential wall, which extends vertically from the bottom wall.

In addition, in this invention, the latching member can be formed from a metal sheet member, which can be attached to the circumferential wall at the securing section. If the latching member is made from a metal sheet member, the flexibility and the strength can be large for small increase in the thickness of the circumferential wall, and simultaneously can exhibit shielding effect. In this case, since the maximum flexibility can be exhibited at the free end, the latching member preferably has a latching section at the free end of the elastic bar.

In this invention, the latching section of the latching member can be formed as a catch, which is bent being generally vertical to the circumferential wall surface, extend inward of the receiving section, and can latch the module. The latching member can be provided along generally whole circumferential wall of the housing. The latching member can be formed such that generally whole circumferential wall is covered by one or a plurality of latching members, and each latching member has a latching section and a securing section.

In this invention, when the outer shape of the part of the module to be placed in the socket is polygonal, the circumferential wall of the housing can be composed by a plurality of wall parts so as to form a polygon that fits to the outer shape of the module when it is viewed from the direction of receiving the module. Correspondingly, the latching member can be formed as a plurality of members, so that latching members are put together at one or more corner sections which is/are the boundary portion(s) of adjacent wall parts.

In this invention, each latching member can have a latching section at one end, which is a free end, in the longitudinal direction, and a securing section at the other end. In this case, each latching member can be designed so as to cover two adjacent wall parts of the circumferential wall.

The latching member can have a slit that extends in the longitudinal direction from one end, which is a free end, to the other end in the longitudinal direction. In this case, an elastic bar can be formed to have a length corresponding to that of the slit. The elastic bar formed in this way is thin and long, so that it can be easily flexed. The latching member can be made from a metal sheet member, and can be designed so as to be arranged on the outer surface of the circumferential wall. In this case, the circumferential wall of the housing preferably has a notch, which allows the catch of the latching section to protrude toward the receiving section.

If each latching member is made from a metal sheet member and has a contact section that contacts with adjacently arranged latching section, latching members are electrically connected to each other, so that grounding can be easily obtained as a shielding case.

In this invention, if the circumferential wall is formed as a part of the housing, and has recesses that are opened upward and enables inserting a tool from the upside between the module and the elastic bar to push the elastic bar outward, the module can be easily removed by simply inserting a tool into the recess. In this case, the notch can be also formed as the recess. Furthermore, in this invention, the latching member and the elastic bar do not have to be made from a metal sheet member, but can be formed using a part of the circumferential wall of the housing.

In addition, in this invention, the securing section and the latching section do not have to be arranged away from each other in the circumferential direction. They can be close to each other in the circumferential direction if they are arranged opposite to each other across the slit, which extends in the circumferential direction.

As described above, in this invention, elastic bar, which extends along the circumferential wall and can be flexed outward, is provided, and a latching section is provided away from the base of the elastic bar. Therefore, when the module is latched by the socket, the elastic bar that is long in the circumferential direction easily displaces outward of the socket, and satisfactory large displacement can be obtained. As a result, without increasing the height of the socket, a module can be attached to the socket with small force, and the latching can be secured. Furthermore, in this invention, the elastic bar can be directly formed on the circumferential wall of the socket, or can be formed as a separate latching member, which can be attached to the circumferential wall and made from a metal sheet.

BRIEF DESCRIPTION OF THE DRAWINGS

FIG. 2(A) illustrates an electronic module, FIG. 2(B) illustrates the socket. FIG. 2(C) illustrates when the module is attached to the socket.

FIG. 3(A) is a side view of the major portion, FIG. 3(B) is a bottom view, and FIG. 3(C) is a cross-sectional view of FIG. 3(A), taken along the line C—C.

FIG. 10(A) is a top view thereof and FIG. 10(B) is a side view illustrating one side.

DESCRIPTION OF THE PREFERRED EMBODIMENTS

Figure 1:
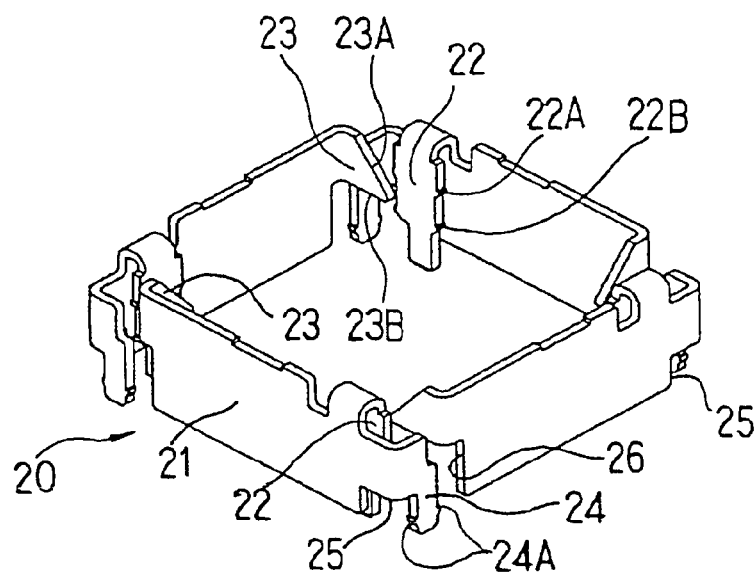
FIG. 1 is an exploded perspective view of the socket as an embodiment of this invention, illustrating the socket before each component is assembled.
Figure 1:
Figure 1:
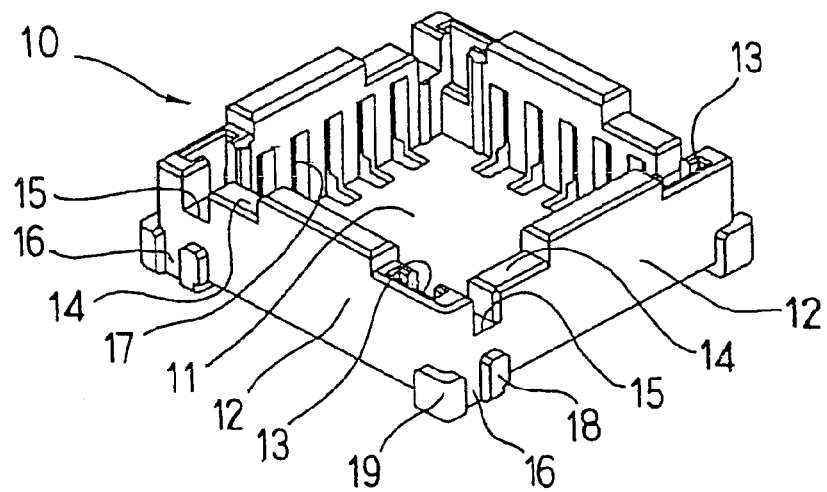
Figure 1:
Figure 1:
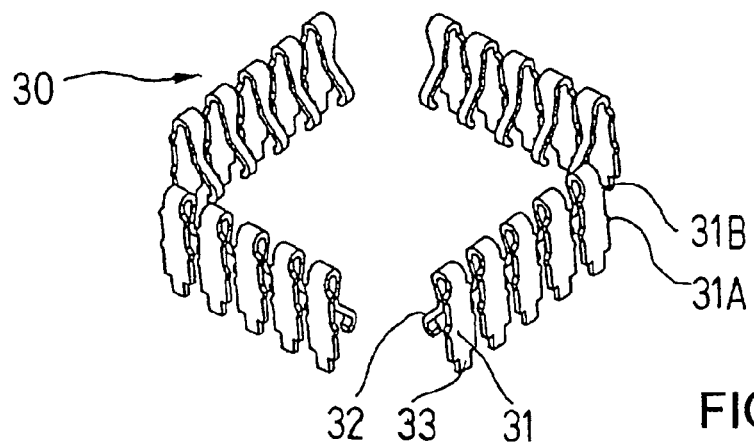

FIG. 1 is an exploded perspective view of the socket for an electronic module in the embodiment of this invention before each component is assembled. In the figure, the referential numeral 10 denotes a housing made from an electrical insulating material. A latching member 20 made from a metal sheet and terminals 30 will be attached to the housing 10.

The housing 10 has a flat bottom wall 11 and a tetragonal circumferential wall 12, which vertically extends from the circumferential edges of the bottom wall 11. This circumferential wall 12 forms space as a receiving section to receive a module therein. A module will be inserted in the receiving section until it contacts with the bottom wall 11. Each of four wall parts of the circumferential wall 12 is formed similarly to each other in the circumferential direction. When each wall part is viewed from the outside, each wall part has a one-step section on the right side and a two-step section on the left side, which are respectively formed so as to have shorter height than that of the middle part of the wall.

A securing groove 13 that extends downward is provided at the right upper edge surface. An indentation 14 and a notch 15 are respectively formed at the upper step section and the lower step section at the upper left edge surface. In addition, a latching groove 16 is formed by two protrusions 18 and 19 at the lower left corners on the outer surface of the circumferential wall. A plurality of terminal grooves 17, which are opened downward and inward, are provided on the housing 10.

As shown in the figure, four latching members 20, which are formed similarly to each other, are provided so as to be attached to four wall parts of the circumferential wall 12 of the housing 10. Each latching member 20 has a flat section 21, which widely contacts with the outer surface of the circumferential wall 12. A securing section 22 is provided at the upper right edge of the flat section 21, and extends inward and downward forming inverted U-shape. A catch 23, which works as a latching section, is provided at the upper left edge of the flat section and extends inward. The lower end of the securing section 22 is formed to protrude lower than the bottom surface of the housing when the latching member 20 is attached to the circumferential wall 12 of the housing 12.

In addition, protrusions 22A and 22B are provided at the both side edges of the securing section 22 so as to latch the housing with the inner surface of the groove when the securing section 22 is pressed into the securing groove 13 of the housing 13. If the lower edge of the securing section 22 is designed so as to be secured onto a circuit board or the like by soldering, it can also work as a metal fixture. The catch 23, which works as a latching section as described above, extends inward of the receiving section being bent at the upper left part of the flat section 21. The catch 23 has a tapered edge 23A, of which the upper edge is tapered downward, and has a stopper edge 23B, which is an edge vertical to the surface of the flat section 21, at the lower edge.

A latching bar 24, which extends downward being perpendicular to the circumferential direction, is provided at the right edge of the flat section 21. This latching bar 24 is designed to be pressed into the above-described latching groove 16, which is formed at the circumferential wall 12 of the housing 10, and has a latching protrusion 24A on the both sides so as to latch the housing with the inner edge of the latching groove 16.

When the latching members are attached to the housing 10, the upper and the lower edges of the flat section 21 fit to the upper and the lower edges of the center part of the circumferential wall 12 of the housing 10, and almost completely cover the outer surface of the circumferential wall 12. Notches 25 and 26 are formed at the left and the right lower edges of the flat section 21, respectively. The lower edge of the flat section 21 are placed between the protrusions 18 and 19 of the housing 10.

As shown in the figure, each terminal 30, which will be pressed from the lower side into the terminal grooves 17 of the housing 10 is formed to have inverted U-shape from a metal piece, and has a flat securing section 31 and a contact section 32. The securing section 31 has latching protrusions 31A and 31B at the edges, which latch with the inner surface of the terminal groove 17 when the terminals are pressed into the terminal grooves 17. A connecting section 33 is formed at the lower edge of each securing section 31, has a narrow step-like shape, and is formed to be positioned slightly lower than the lower surface of the housing.

The contact section 32, which is formed at the upper edge of each flat securing section 31, is bent inward and extends downward, so as to have V-shape that tilts inward and downward. The contact section 32 has elasticity so as to elastically contact with the corresponding section of the counter module at the top portion. Each contact section 32 is arranged so as to protrude inward from the opening of the terminal groove on the inner surface of the housing 10. The latching members 20 and the terminals 30 are attached to the housing 10 respectively from the upper side and from the lower side of the housing, respectively. As a result, the socket 41 is obtained as illustrated in FIG. 2(B).

Once the latching members 20 are attached and contact to the outer surface of circumferential wall 12 of the housing 10, the securing section 22 and the latching bar 24 of each latching member 20 are secured onto the housing by the securing groove 13 and the latching groove 16, respectively. The securing section 22 and the latching bar 24 are diagonally arranged to each other on the generally rectangular flat section 21. Therefore, the latching member can suitably resist to the force from the module when the elastic bar is elastically displaced by the force.

However, the flat section 12 is not latched onto the housing in a range from the left side of the securing section 22 to the catch 23, so that it works like an elastic bar. In other words, if the flat section 12 receives external force, it can be elastically flexed outward (in a direction vertical to the flat section surface) from the securing section 22. At this time, largest elastic displacement is generated at the catch 23. When external force is not applied, this catch 23 is arranged in the notch 15 of the housing, and the end of the catch 23 extends inward than the circumferential wall 12 and reach and interferes with the module, which will be described later.

Figure 2A:
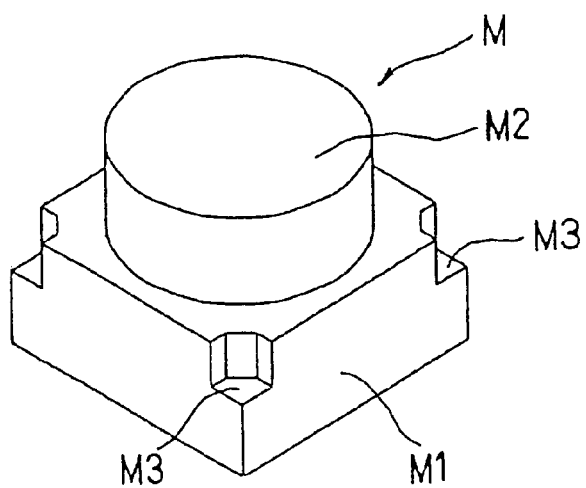
FIGS. 2(A)–(C) are perspective views of the assembled socket of FIG. 1 and the electronic module that is to be attached to the socket.
Figure 2B:
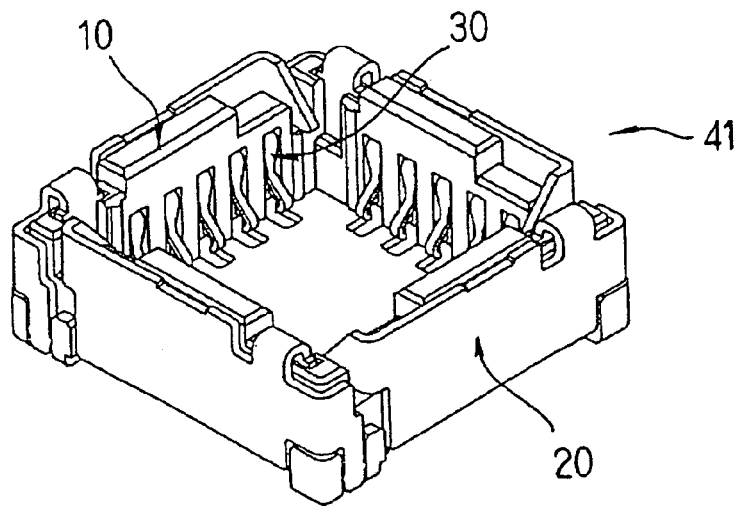

As shown in FIG. 2(A), for example, the module M, which is to be mounted in the socket 41, is comprised of a base portion M1, which has a shape of relatively flat rectangular solid, and a short cylindrical portion M2. Necessary electronic components and circuits are built in the module M. The base portion M1 is a portion to be placed in the socket, so that it will be placed in space formed as a receiving section by circumferential wall 12 of the socket 41. Contact sections (not illustrated) are provided on the circumferential wall surface of the base portion M1, and contact with the contact sections of the corresponding terminals 30 of the socket 41.

A latching notch M3 is provided at four corners on the upper surface of the base portion M1. When the base portion M1 is placed in the socket 41, the catches 23 of the latching members 20 of the socket 41 are latched in the latching notches M3.

The socket of this embodiment is used as follows and a module is mounted therein.

(1) For example, the socket 41 is attached to a circuit board (not illustrated), and the connecting sections 33 of the terminals 30 are connected to the corresponding circuit sections of the circuit board at the lower surfaces by soldering.

Figure 2C:
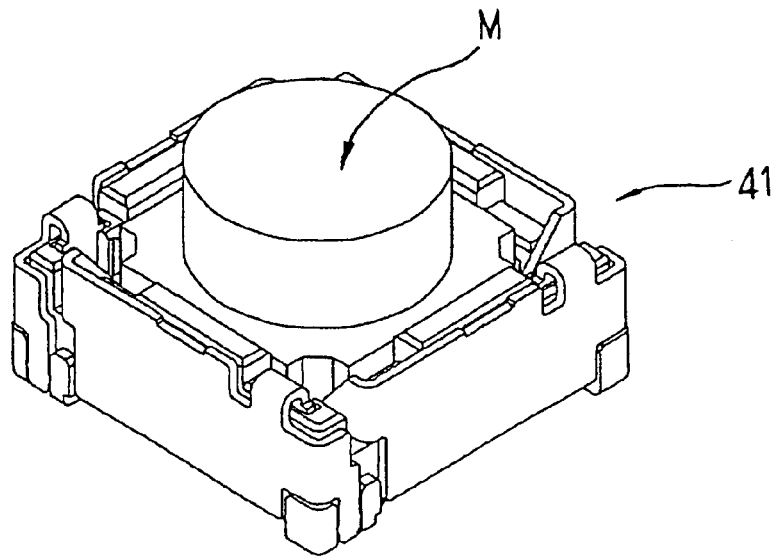

(2) Then, the module M is attached to the socket 41 (See FIG. 2(C)). In this attaching process, since the base portion M1 of the module M presses the tapered sections 23A of the catches 23 of the latching members 20 from the upside by the lower circumferential edges, the catches 23 are pressed outward by a divided pressing force, so that the latching members 20 are flexed in a direction away from the circumferential wall 12 having the securing section as a base and the catches 23 as free ends. The largest displacement by this flexing is generated at the catches 23, which are free ends. By this displacement, the base portion M1 of the module M can be further inserted in the socket.

Once the latching notches M3 of the module M reach the catches 23, flexing of the latching members 20 are released and the catches 23 latch the module at the latching notches M3. Accordingly, the module M is prevented from coming off from the socket, and held securely. Once the base portion M1 is placed in the position, the module M is electrically connected to the circuit board via the terminals 30.

Figure 3A:
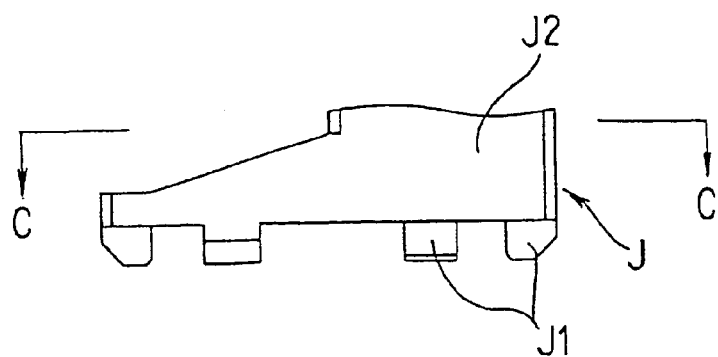
FIGS. 3(A)–(C) are views of a tool for taking out the module from the socket of FIG. 2.
Figure 3B:
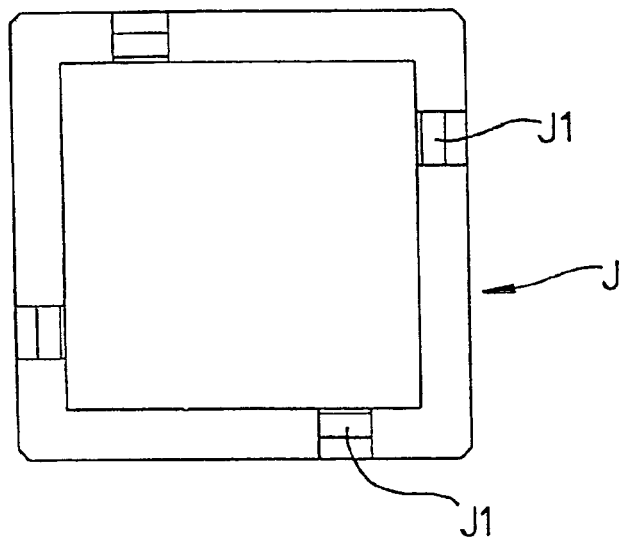
Figure 3C:
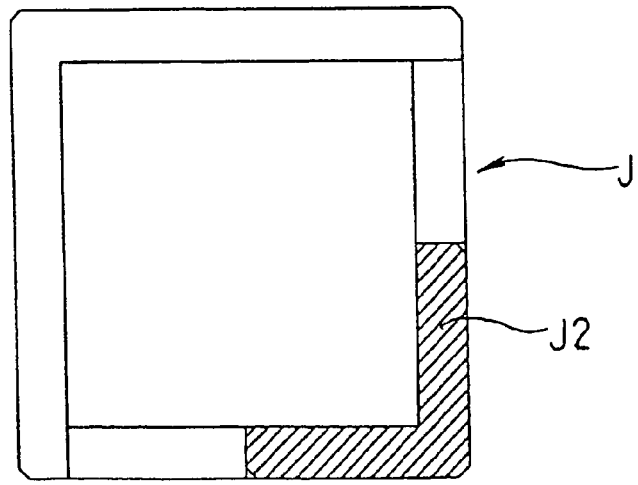

(3) There is space at each indentation 14 of the circumferential wall 12 of the housing between the latching member 20 and the side surface of the base portion M1 of the module. Each space has a dimension corresponding to the thickness of the circumferential wall and is opened upward. Therefore, the module M can be removed from the socket by using a tool illustrated in FIG. 3 to the space. As shown in FIG. 3(B), the tool J has a shape of tetragonal frame, and has legs J1, each of which has a tapered surface, on the bottom surface of the tool. Those legs J1 are provided corresponding to the positions of the four recesses 14 of the socket 41.

In addition, a handle section J2 extends upward from a part of the circumferential wall of the tool J. If the legs J1 are pressed into the corresponding recesses 14 by holding the handle section J2, the legs J1 presses and flexes outward the flat sections 21 of the latching members 20, so that the catches 23, which work as latching sections, come off from the latching notches M3 of the module M, and the module M can be removed. Since the elastic bars of the latching members extend in the circumferential direction, the latching members can be flexed outward at and near the latching sections, and the module M can be removed easily, which gives some degree of freedom in designing the shape of the latching sections.

The present invention is not limited by the embodiments illustrated in FIGS. 1 and 2, but can be modified or altered within the scope of the invention.

Figure 4:
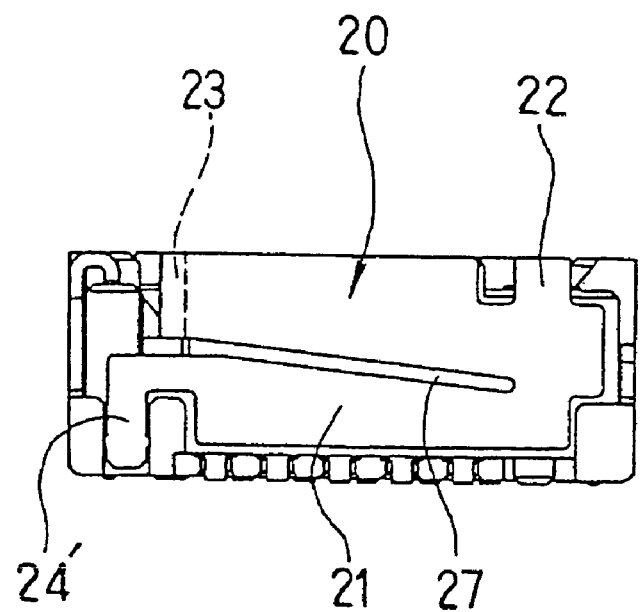
FIG. 4 is a side view of an example of modification of the socket of FIG. 1.

For example, as shown in FIG. 4, if a slit 27 is formed on the flat section 21 of each latching member 20 from the free end side, where a catch is formed, toward the securing section, upper part of the elastic bar than the slit 27 has satisfactory elasticity, so that the catch can be easily displaced as a latching section at the free end of the elastic bar. Furthermore, without forming the securing section of FIG. 4, the latching members can be secured in position only by latching bars 24'. Even if the latching sections 23 and the latching bars 24' are arranged at the same positions or close position in the circumferential direction, since there is a slit between the elastic bar and the latching bar, the elastic bars can have enough length in the circumferential direction in spite of the existence of the latching bars 24', and can exhibit enough elasticity.

Figure 5:
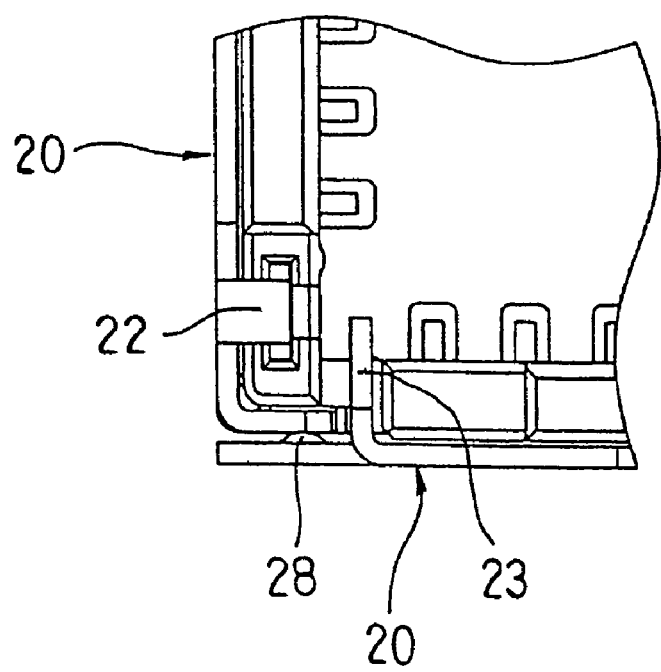
FIG. 5 is a top view of another example of modification of the socket of FIG. 1.

If the latching members 20 are made from a metal sheet, the latching members generally surround the whole circumferential wall 12 of the housing, so that they work like a shielding sheet. In this case, if four latching members 20 contact with each other via semispherical protrusions 28 as shown in FIG. 5, for example, they can be electrically connected to each other, and therefore can be easily grounded.

In FIGS. 1 and 2, four separate latching members are formed corresponding to the four wall parts of the circumferential wall of the housing. However, the latching members can be formed such that one latching member covers a plurality of the wall parts.

Figure 6:
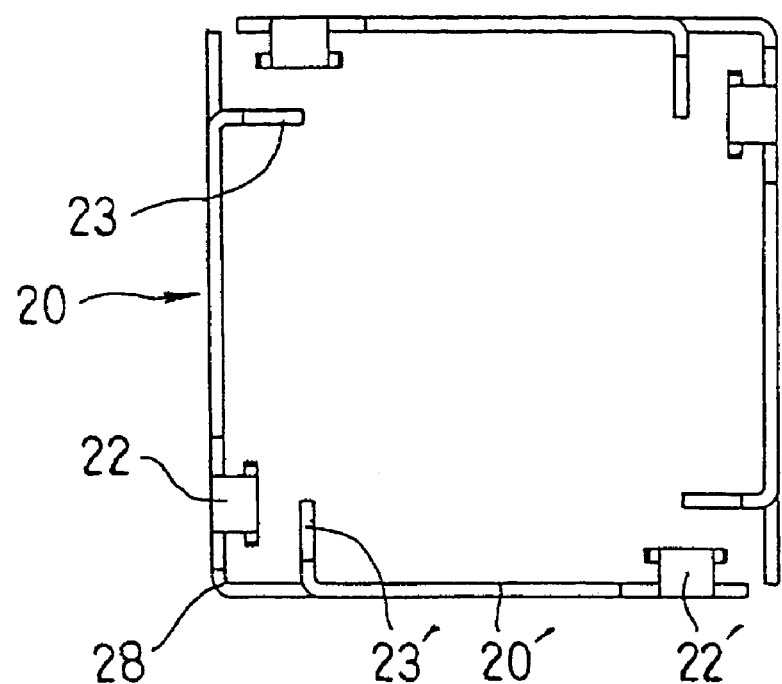
FIG. 6 is a top view of an example of modification of the latching member used in the socket of FIG. 1.
Figure 7:
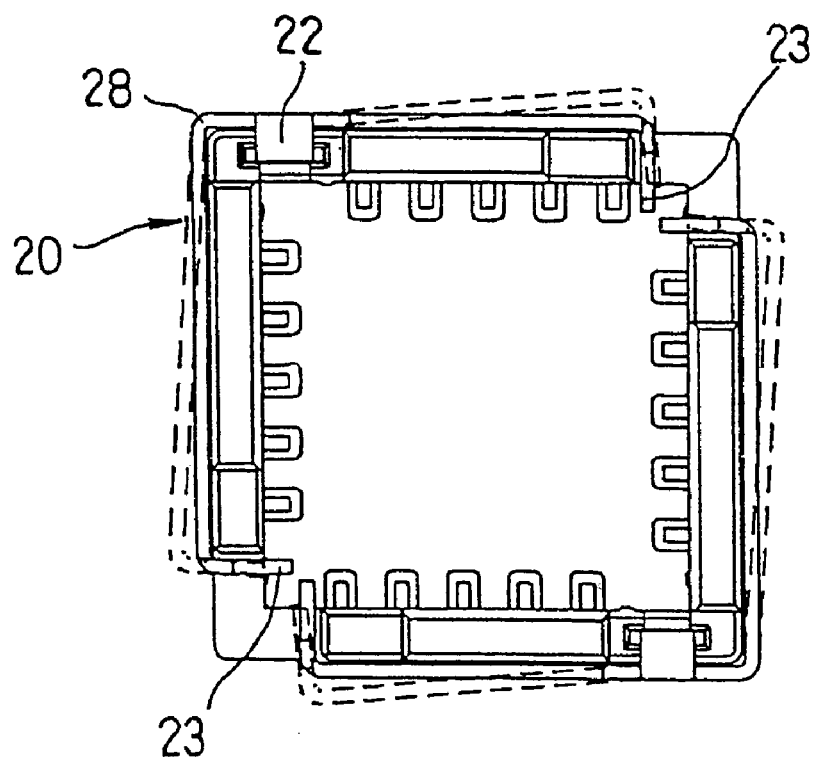
FIG. 7 is a top view of another example of modification of the latching member of the socket of FIG. 1.
Figure 8:
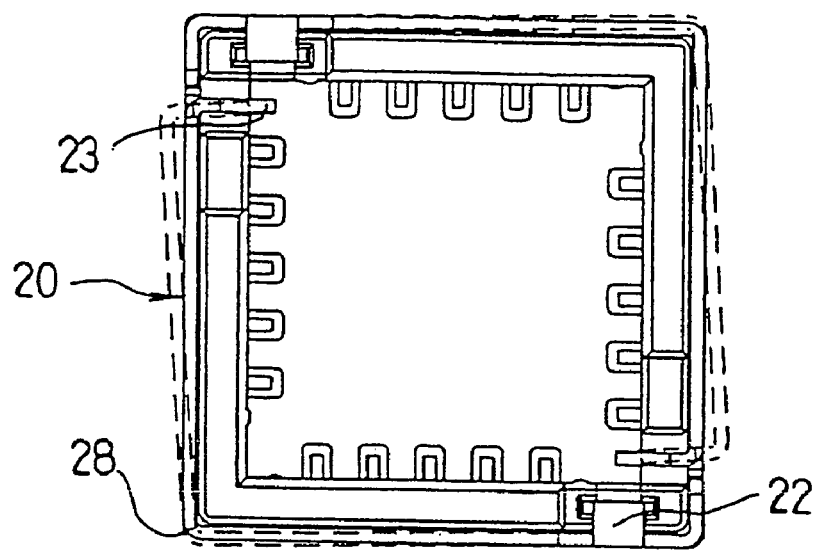
FIG. 8 is a top view of yet another example of modification of the latching member of the socket of FIG. 1.

In the examples illustrated in FIGS. 6–8, one latching member has an L-shape, and covers two adjacent wall parts. In the example of FIG. 6, two latching members are jointed at the joint sections 28 at the bent corner sections. In this case, the latching member 20 having a catch 23, which works as a latching section, at the free end can be identical to the one in FIG. 1. However, in order to secure displacement at the catch 23', it is preferred that the latching member 20', which has the catch 23' near the joint section 28, has a slit as shown in FIG. 4. Here, in FIG. 6, the securing sections are denoted by the reference numerals 22 and 22'.

In the example of FIG. 7, the latching member has a securing section 22 only near the joint section at the corner section, and has a catch 23, which works as a latching section, at both ends, which are free ends. Accordingly, in this example, the latching member 20 is displaced at the both ends about the securing section, as shown with the broken line in the figure.

In the example of FIG. 8, each L-shaped latching member 20 has a securing section at one end, and a catch 23 at the other end. In this case, it does not have a securing section near the joint section at corner section, which is a bent portion. Therefore, the latching member 20 flexes at one side about the securing section. Accordingly, the joint section 28 displaces and then the catch 23 displaces relative to the joint section 28. Therefore, two displacements are superimposed to the displacement at the catch 23, and therefore the catch 23 significantly displaces.

Figure 9:
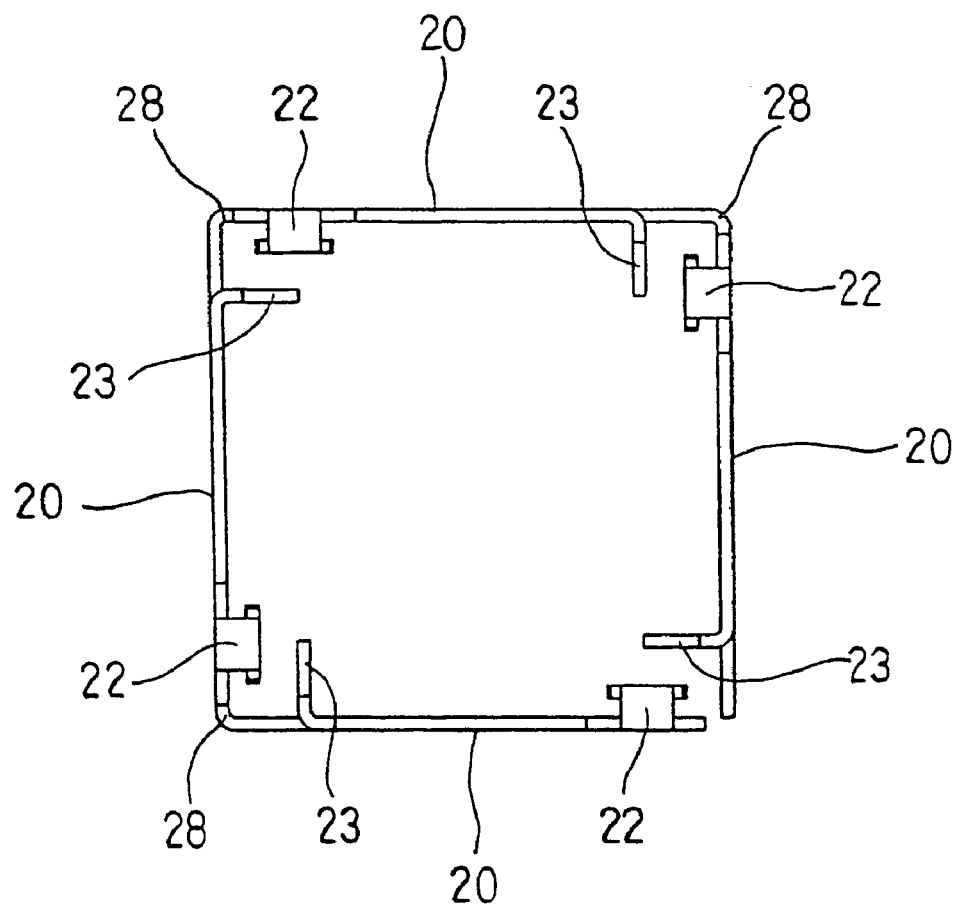
FIG. 9 is a top view of still another example of modification of the latching member of the socket of FIG. 1.

The latching member does not have to have a shape that extends over two wall parts. The shape of the latching member can be generally square-bottomed U-shape, and attached to the wall part by putting close to another latching member having similar shape at the center part of the wall part. In the case illustrated in FIG. 9, four latching members of FIG. 1 are jointed at the joint sections at three corner sections. This constitution can be obtained by consecutively bending and configuring the latching members at three joint sections 28. Furthermore, in this case, similarly to the example of FIG. 6, the latching member having a catch 23 at the portion other than the free end has a slit as illustrated in FIG. 4. If the wall part has enough length in the circumferential direction, the latching member can have a securing section corresponding to the center part of the wall part, and latching sections at free ends at the both free ends.

Figure 10A:
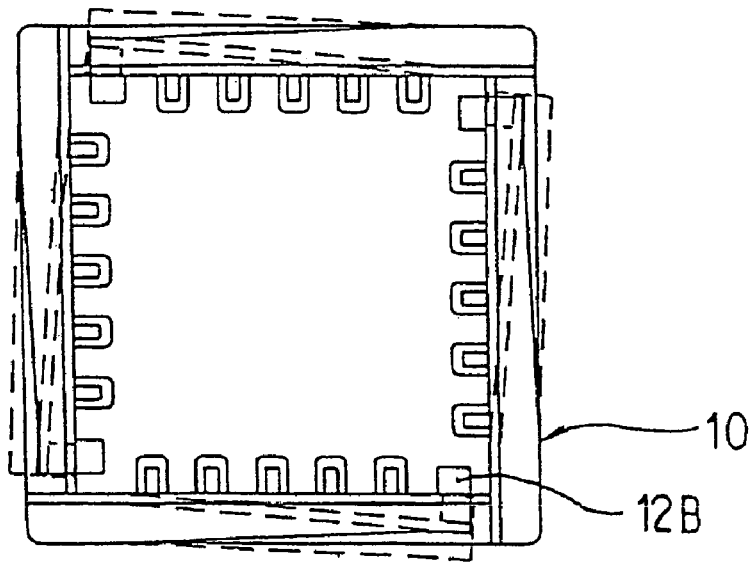
FIGS. 10(A)–(B) are views of another embodiment of this invention.
Figure 10B:
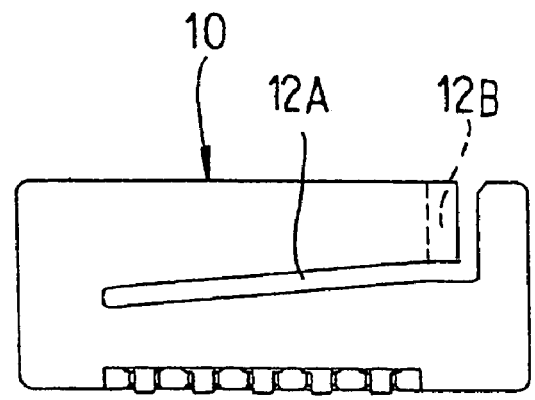

The latching member does not have to be made from a metal sheet. Alternatively, an elastic bar of the latching member can be formed using a part of the circumferential wall by forming a slit on the circumferential wall of the housing. FIG. 10(A) is a top view of this example, and FIG. 10(B) illustrates one of outer side surfaces of the four wall parts of the circumferential wall of the housing. A slit 12A, which extends downward from the right upper edge and then curved leftward, is formed at one wall part. The upper part than this slit 12A is an elastic bar, and has a catch 12B, which protrudes inward and works as a latching section, is provided at the free end. Accordingly, when the module is attached to the socket, the elastic bar is flexed as shown by the broken line in FIG. 10(A), and the catches B displace outward. When shielding property is not required, the housing can work as a latching member, which enables the reduction of the number of components and is therefore economical.

Figure 11:
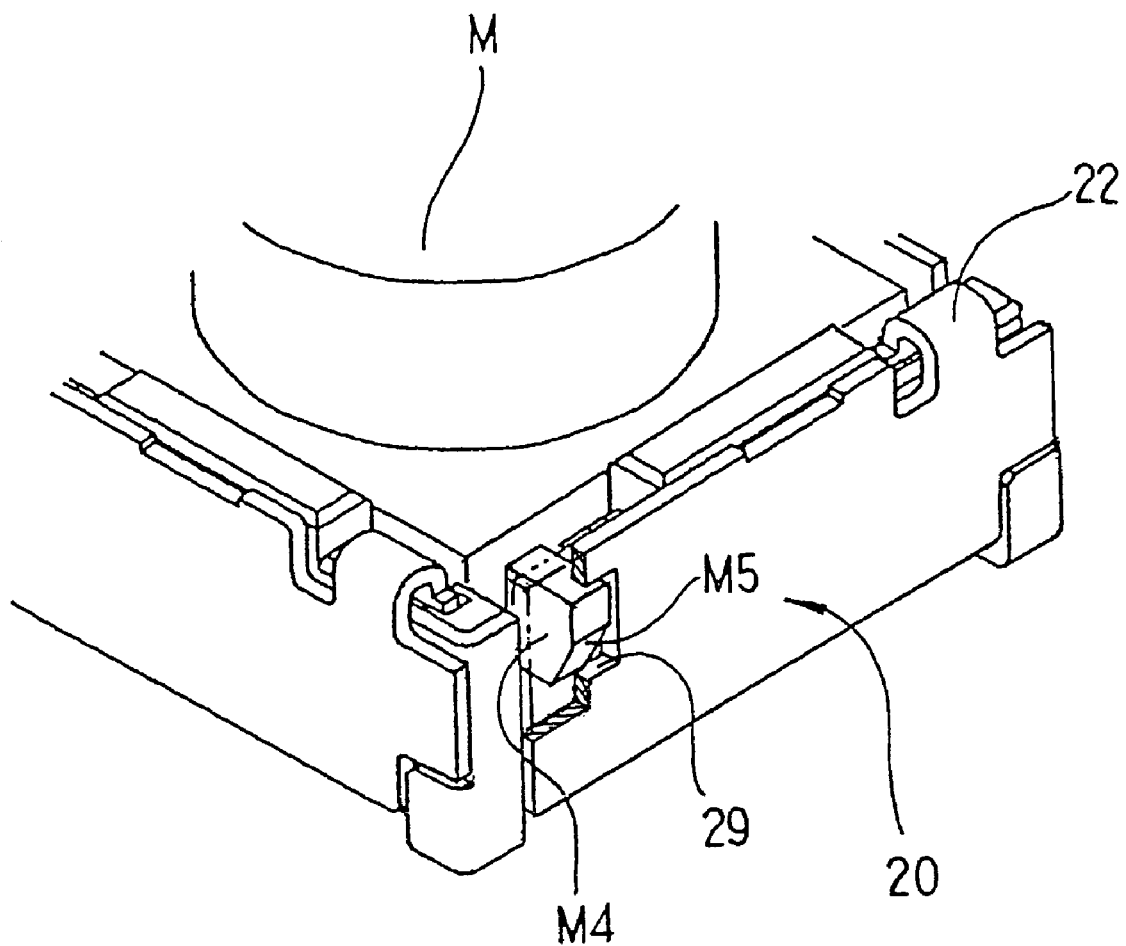
FIG. 11 is a perspective view of another embodiment of this invention.

The latching member does not have to have a catch, which works as a latching section, but for example, it can have a bar that extends from the upper edge of the latching member and is bent toward the inside of the receiving section. Also, it can be formed like a lance by cutting the middle part of the elastic bar. In addition, as shown in FIG. 11, the latching member can be formed as a window 29, and the module M can have a latching protrusion M4. In this case, the latching protrusion can be easily latched in position by the window 29 at the time of attaching the module M, if the latching protrusion M4 has a tapered section M5 at the portion that contacts with the lower edge of the window 29.

Figure 12:
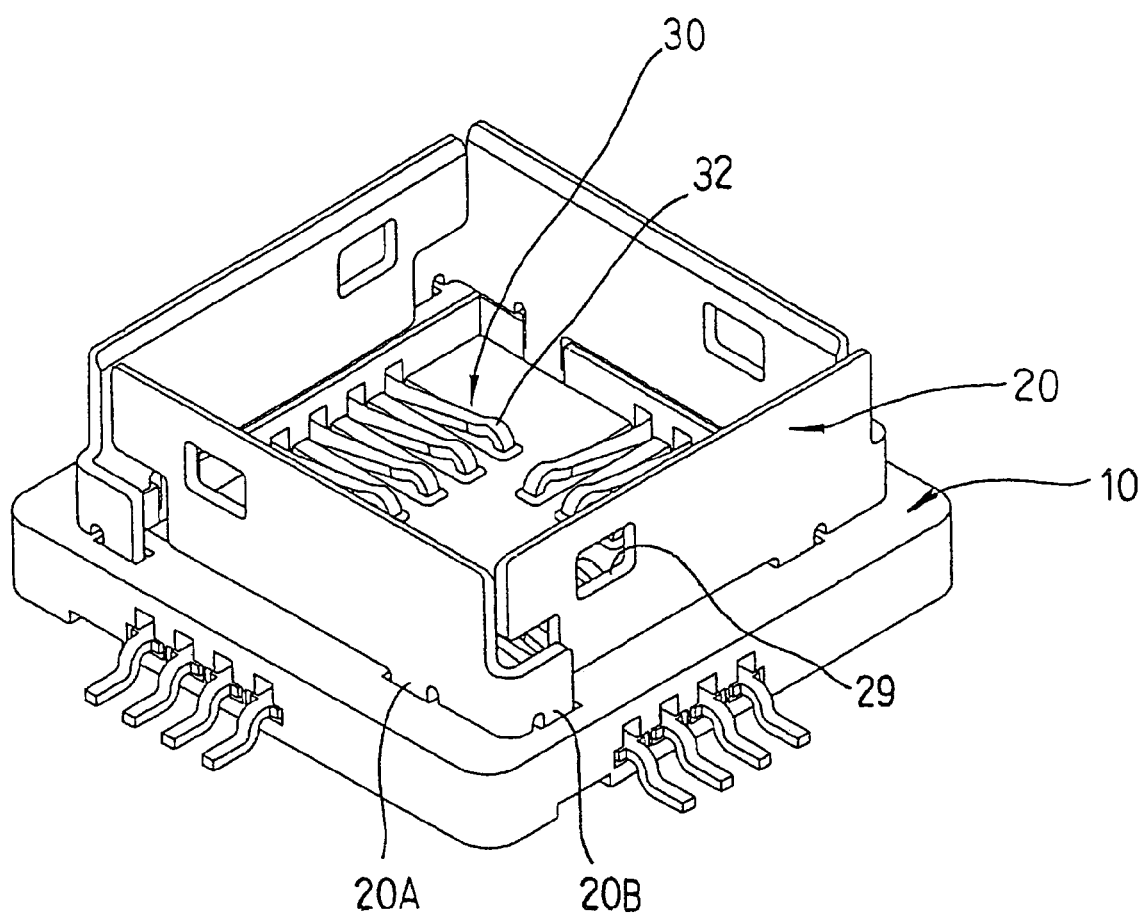
FIG. 12 is a perspective view of yet another example of this invention.
Figure 13:
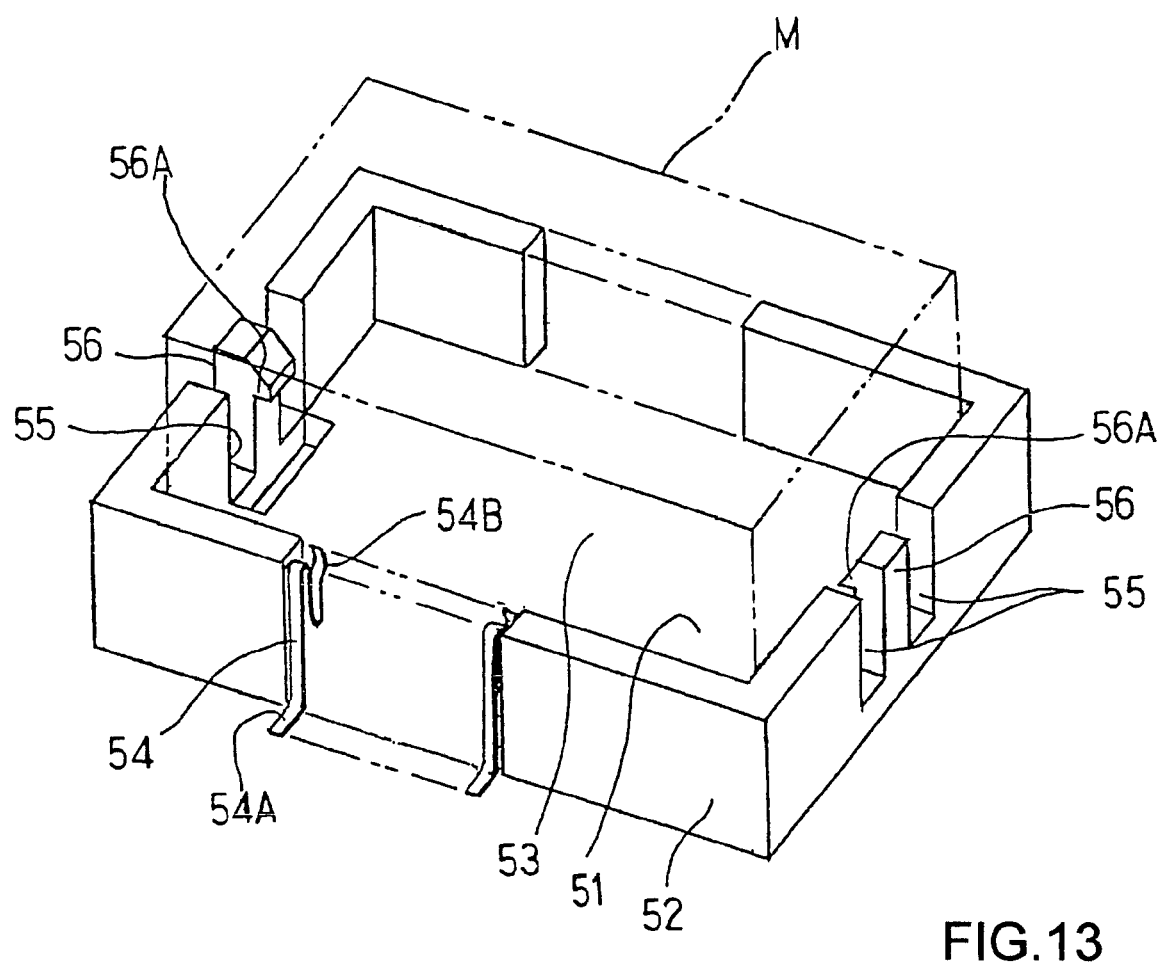
FIG. 13 is a schematic perspective view of an example of conventional socket.

Furthermore, in this invention, the circumferential wall does not have to be formed by the housing, but can be formed by the latching member itself, and the housing can have only bottom wall, which is a contact portion. For example, in FIG. 12, the circumferential wall is formed by attaching four latching members 20 made from a metal sheet to a flat housing 10. Contact sections 32 of the terminals 30 are exposed and arranged on the upper surface of the housing 10. At one edge of each latching member 30, the mounting legs 20A and 20B are pressed into corresponding holes of the housing, and the other edge is free end, which can be flexed. This free end has a window 29, which is similar to the one in the latching member of FIG. 11. Accordingly, in the example of FIG. 12, the module to be attached has latching protrusions M4 similar to the ones in FIG. 11.

Furthermore, in this invention, the latching member can be differently configured according to the outer shape of the module. The part of the module, which is to be placed in the socket, does not have to be rectangular solid. For example, if the circumferential shape of the part of the module to be placed in the socket is circular, the receiving concave section of the socket can be correspondingly circular by using suitable number of latching members.

In addition, if the latching members are formed from a metal sheet for example, they can be formed with the housing as one-piece component by deeply setting them in the circumferential wall as core bars. In this case, as easily understood, only elastic bars are exposed to the outside. Furthermore, the recesses for inserting the tool, which are formed at the circumferential wall of the housing, and the notches for catches can be formed as same sections which work as the recess and the notch.

Moreover, the terminals do not have to be arranged in a straight line as long as it is along the circumferential wall. For example, the terminals can be arranged in a plurality of rows.

The latching section of each latching member does not have to be the one, which elastically displaces by contacting with the counter module and then releases the displacement. For example, it can be designed, such that the latching section is being contacting with the module and being elastically displaced at normal condition and latches or releases the module onto/from the socket according to the size of the displacement. In addition, it can be also designed, such that the latching section does not contact with the module but is arranged in restricting position so as to prevent the module from accidentally coming off from the socket.

In addition, the receiving section to place the counter module can be formed without using the housing. For example, it can be formed by attaching latching members, which work as the circumferential wall and are made from a metal sheet, to the member to connect at the securing sections, and forming the receiving section by the upper surface of the connected member and the latching members. In this case, the upper surface of the connected member forms a restricting section for the module. In addition, when the module does not contact with the connecting member, the restricting section to define the receiving position can be formed by providing protrusion or the like at the latching members.

The invention claimed is:

1. A socket for an electronic module, comprising:
   a receiving section formed by a circumferential wall and a restricting section that defines a position of a counter module in said receiving section when said module is placed therein;
   a plurality of terminals arranged along said circumferential wall, each of said terminal having at one end a connecting section that can be connected to a circuit board and has at the other end a contact section that contacts with corresponding section of said module placed in said receiving section;
   a latching member, which is formed by directly forming or attaching onto said circumferential wall an elastic bar that extends in a circumferential direction of said circumferential wall;
   wherein said latching member has a securing section and a latching section that elastically displaces outward of said circumferential wall by flexion of said elastic bar, said securing section and said latching section are provided away from each other in the circumferential direction, said elastic bar elastically flexes and displaces by contacting with said module so as to enable reception of said module in said receiving section, and said latching section latches said module, said elastic flexing displacement being released or reduced when said module reaches a specified position in said receiving section.

2. The socket for electronic module according to claim 1, wherein said receiving section is formed by a housing made from an insulating material, and said housing has a bottom wall and said circumferential wall that vertically extends from said bottom wall.

3. The socket for an electronic module according to claim 1, wherein said latching member is made from a metal sheet member, which is attached to said circumferential wall at said securing section.

4. The socket for an electronic module according to claim 2, wherein said latching member has a latching section at a free end of said elastic bar.

5. The socket for an electronic module according to claim 4, wherein said latching section of said latching member is bent generally vertically to a surface of said circumferential wall, extends inward of said receiving section, and has a catch that can latch said module.

6. The socket for an electronic module according to claims 1, wherein said latching member is provided to cover almost the whole circumferential wall of said housing, is comprised of one or a plurality of latching members being divided in said circumferential direction, each of said latching members has said latching section and said securing section.

7. The socket for an electronic module according to claim 6, wherein said circumferential wall of said housing is comprised of a plurality of wall parts so as to form a polygonal shape when said circumferential wall is viewed from a receiving section of said module, and each latching member is formed so as to be jointed at one or more corner sections, which are boundary portion of adjacent wall sections.

8. The socket for an electronic module according to claim 1, wherein each latching member has said latching section at one edge, which is a free end, in a longitudinal direction, and has said securing section at the other edge.

9. The socket for an electronic module according to claim 1, wherein each latching member has said securing section at both edges in a longitudinal direction, which are free ends, and has said securing section at a middle part.

10. The socket for an electronic module according to claim 7, wherein each latching member extends over two adjacent wall sections.

11. The socket for an electronic module according to claim 1, wherein each latching member has a slit that extends from one end toward the other end in a longitudinal direction, and has an elastic bar, which has a length corresponding to that of said slit.

12. The socket for an electronic module according to claim 5, wherein each latching member is made from a metal sheet member and attached so as to be on the outer surface of said circumferential wall, and said circumferential wall of said housing has a notch that allows said catch of said latching member to extend toward said receiving section.

13. The socket for an electronic module according to claim 6, wherein each latching member is made from a metal sheet member and has a contact section that contacts with an adjacently arranged contact section of an adjacent latching member.

14. The socket for an electronic module according to claim 1, wherein said circumferential wall of said housing has a recess, which is opened upward, so as to be able to insert a tool from an upper side between said module and said elastic bar to push said elastic bar outward.

15. The socket for an electronic module according to claim 12, wherein said notch is provided also as said recess.

16. The socket for an electronic module according to claim 11, wherein said elastic bar of said latching member is made from a part of said circumferential wall of said housing.

17. A socket for an electronic module, comprising:
a receiving section formed by a circumferential wall and a restricting section that defines a position of a counter module in said receiving section when said module is placed therein;
a plurality of terminals arranged along said circumferential wall, each of said terminal having at one end a connecting section that can be connected to a circuit board and has at the other end a contact section that contacts with a corresponding section of said module placed in said receiving section;
a latching member, which is formed by attaching an elastic bar that extends in a circumferential direction of said circumferential wall onto said circumferential wall;
wherein said latching member has a securing section and a latching section that elastically displaces outward of said circumferential wall by flexion of said elastic bar, said securing section and said latching section are provided opposite to each other across a slit provided for forming said elastic bar, said elastic bar elastically flexes and displaces by contacting with said module so as to enable reception of said module in said receiving section, and said latching section latches said module, said elastic flexing displacement being released or reduced when said module reaches a specified position in said receiving section.

* * * * *